DIFFUSION BONDING
Filed July 25, 1963
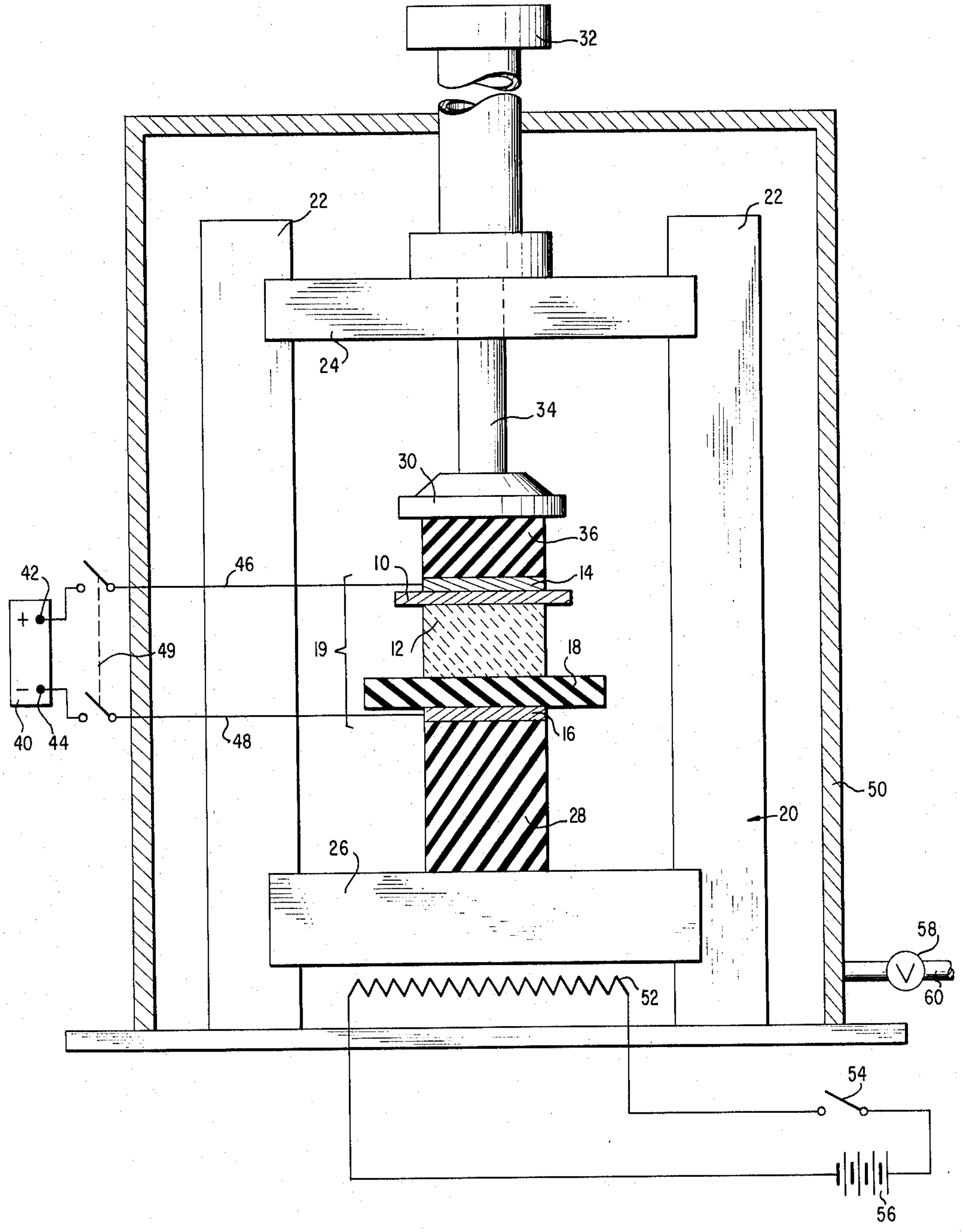
INVENTORS
IRVIN R. KRAMER
CHARLES F. BURROWS
BY
Sughrue, Rothwell, Mion and Zinn
ATTORNEYS

3,256,598
DIFFUSION BONDING

Irvin R. Kramer, Baltimore, and Charles F. Burrows, Lutherville-Timonium, Md., assignors to Martin Marietta Corporation, New York, N.Y., a corporation of Maryland Filed July 25, 1963, Ser. No. 297,596
16 Claims. (Cl. 29—484)

This invention relates to diffusion bonding and more particularly to a method which utilizes an impressed voltage as a means for producing and accelerating a diffusion-type bond.

The method of the present invention may be advantageously applied to the forming of metal-to-ceramic bonds but is not necessarily limited thereto and has an additional application to the bonding of semiconductors to metals as well as to effecting the metal-to-metal bonds.

In the past, in order to produce a good mechanical bond between a ceramic material, such as silicon carbide, and a metal supporting member, it has been necessary to first metallize the silicon carbide surface, utilizing a spray coating of one of the following: molybdenum, Nichrome, Kovar, silver, etc. In addition, the bonding treatment is normally accomplished at a high temperature ranging from 1600° F. to 2200° F. in a vacuum or inert atmosphere. In most cases, unless extreme care is exercised, the silicon carbide material cracks during cool-down from brazing temperatures because of the high stresses developed due to the differences in coefficient of expansion values between the ceramics and metals.

In an attempt to overcome these difficulties, low temperature solid state diffusion bonding techniques have been resorted to. Solid state diffusion bonding may be defined as a joining or bonding method in which the materials to be joined are heated to temperatures below their solidus temperature and are held in contact for some length of time. No liquid phase is formed and the bonding occurs by movement of atoms or ions across the interface on the surfaces where contact occurs. Diffusion occurs in both directions across the interface, at rates which are determined by the diffusion coefficient of the respective materials. The diffusion rate increases with temperature. In the past, the usual practice for joining metals by diffusion bonding employed temperatures sufficiently high so that grain growth could occur rapidly across the joint interface. Conventional diffusion bonding techniques require relatively extensive time periods at temperature to effect a strong bond, generally extending for many hours depending upon the temperature. Large grains resulting from this treatment decrease the ductility of the metal and in many cases such as for refractory metals, the material becomes exceedingly brittle.

It is therefore the primary object of this invention to provide an improved diffusion bonding method which utilizes an electrical potential across the interface to effect rapid diffusion of the ions to produce a strong adherent bond.

It is a further object of this invention to provide an improved diffusion bonding method which has application to bonding ceramics, semiconductors or metals to other semiconductors or metals.

It is a further object of this invention to provide an improved bonding method in which the bonds are generally stronger than the material forming the elements to be bonded.

It is a further object of this invention to provide an improved diffusion bonding method which has application to material which would normally be crushed due to the excessive pressure of conventional diffusion bonding techniques.

Further objects of this invention will be pointed out in the following detailed description and claims and illustrated in the accompanying drawings which disclose, by way of example, the principle of this invention and the best mode which has been contemplated of applying that principle.

In the drawings there is shown a schematic elevational view of an apparatus employing the method of the present invention.

In general, the method of the present invention allows the bonding of a first element which may be either a ceramic, a semiconductor or a metal to a second element which may be either a semiconductor or a metal. The selected materials have different diffusion coefficients. The method comprises the steps of forming a stacked array including in order; a first electrode, an insulative barrier, one of said elements, said other element and a second electrode, exerting sufficient pressure on said stacked array to effect intimate contact between the individual members of the stack and subjecting the pressurized stacked array to a relatively low temperature for an extended time period while creating across the electrodes a direct current potential difference sufficient to effect the diffusion of one of the elements in the other to produce a good mechanical bond therebetween. The direct current potential, however, is insufficient to effect extensive current flow between the electrode and breakdown of the insulative barrier. Ionic diffusion occurs principally from the more soluble to the less soluble material and in the direction towards the material having the highest diffusion coefficient.

The method of the present invention has particular application to the bonding of a ceramic material to a metal. In practicing the method of the present invention in one form, an apparatus such as that shown in the drawings may be effectively utilized to achieve a mechanical bond of high strength between silver-plated molybdenum and silicon carbide, aluminum oxide, zirconium oxide or beryllium oxide. In this example, an assumption is made that the metal plate to be bonded indicated at 10 is a sheet of molybenum which is silver-plated to effect a better bond between the metal and the ceramic. Positioned adjacent to the silver-plated molybdenum sheet 10 and in contact therewith, is the ceramic specimen which in this example may be silicon carbide. The specimen 12 and the metal plate 10 are sandwiched between a pair of spaced electrodes. A first or positive electrode 14 is positioned in contact with the free surface of the metal plate 10 to be bonded, while the second or negative electrode 16 is separated from the free surface of the specimen by an insulative barrier or member 18 which acts as an arcing barrier to prevent discharge between the electrodes as a result of the relatively high positive potential applied thereto and to prevent the flow of electric current.

This stacked array 19 is positioned within a suitable press indicated at 20 comprising a pair of spaced vertical members 22 and a pair of spaced horizontal members 24 and 26. The lower horizontal support member 26 has positioned thereon an insulator block 28 which supports the stacked array and isolates the array electrically from the press. The upper horizontal member 24 supports a swivel platen indicated at 30 which is connected to an element indicated at 32 by member 34 which passes through the upper horizontal support member 24. Element 32 applies a compressive force through an insulator member or block 36 which is positioned between the swivel platen 30 and the first electrode 14. Element 32 may be a hydraulic source and element 34 may be a reciprocating ram member.

The press 20 is only one form of several arrangements of a conventional nature which may be used for producing intimate contact between the members 10, 12, 14, 16, and 18 forming the stacked array 19. In conventional diffusion bonding processes, extremely high pressures are required. This is not the case in the method of the present invention in which only pressure sufficient to effect intimate contact between the members is required. The ionic diffusion and subsequent bonding results primarily from the application of the potential difference across the electrode at a relatively low temperature for an extended period of time.

In order to provide the desired electrical potential across the spaced, insulated electrodes 14 and 16, a high voltage power supply indicated at 40 has positive potential terminal 42 and negative potential terminal 44. Positive terminal 42 is connected to positive electrode 14 by conventional electrical conductor 46, while the negative potential terminal 44 of the voltage supply is connected to the negative or second electrode 16 by conductor 48. It is important to note that the high voltage power source must provide a direct current potential across the electrode and that the connections between the high voltage source and the respective electrodes are such that the positive ions of the metal or semiconductor tend to move toward the negative potential electrode and thereby effect diffusion bonding at the interface between the two elements to be bonded. As a corollary to the movement of ions or diffusion of ions from the member adjacent the positive electrode toward the second element, in this case the ceramic specimen silicon carbide, a slight current flows due to the diffusion of the ions. This current is of the order of $2\times10^{-6}$ amperes.

In order to achieve a satisfactory bond in a reasonable time, commensurate with commercial practice, the process is carried out at an elevated temperature by raising the temperature of the stacked array, or more specifically the two elements 10 and 12 to be bonded, to temperature in the vicinity of 800° F. Schematically, the apparatus in the drawing may include a housing 50 which acts to thermally isolate the press and the stacked array. One conventional method of raising the temperature of the elements 10 and 12 involves the passage of electrical current through a heating coil indicated at 52, which is positioned within the housing, by closure of switch 54 which connects the coil 52 to a source of current such as battery 56. In order to prevent oxidation of either of the elements 10 or 12 in the stacked array, it may be necessary to provide an inert atmosphere within the housing 50. Conventional means are employed such as the utilization of valve member 58 which controls the introduction of the inert atmosphere into the sealed housing 50 through conduit 60 connected to a source of inert gas (not shown).

Under the method of the present invention, after sufficient pressure is exerted by member 32 on the swivel platen 30 to effect intimate contact between the elements of the stacked array 19, the switch 54 is closed to energize the electric heating coil 52 to heat the elements 10 and 12 to the desired temperature.

With the simultaneous closing of double-pole, single-throw switch 49, the high voltage power supply is connected to the spaced electrodes 14 and 16. The high voltage applied across the specimen 12 produces an electrical potential which causes the silver metal ions of the silver-plated molybdenum sheet 10 to diffuse into the ceramic silicon carbide specimen. This diffusion process produces a strong adherent bond on the positive side of the connection adjacent to the silver-plated molybdenum and no bonding to the negative side. That is, no bond occurs between the insulative barrier 18 and the ceramic specimen 12. If desired, valve 58 may be opened to allow an inert atmosphere to permeate housing 50 and prevent oxidation of any of the surfaces prior to or during the bonding operation.

The method of the present invention is best described in conjunction with specific elements to be bonded. The method, however, is applicable to the bonding of ceramics, semiconductors or metals and to other semiconductors or metals. In general, suitable bonds have been obtained over a temperature range of 800° to 1100° F. for extended time periods of two to twenty-four hours, depending upon the material combinations employed, and with an electrical potential of 500 to 10,000 volts direct current and currents that range between 2 and 80 microamperes. It is to be noted that the time to accomplish a satisfactory bond decreases with an increase in temperature and applied voltage. As a practical matter, the voltage must not exceed that which would result in breaking down the insulative barrier 18, elements 10 and 12, or the creation of arcing between the spaced electrodes 14 and 16. Where one or more of the materials are insulative in nature, it may not be required to place a separate insulative barrier in series therewith to prevent excessive current flow through the materials to be bonded. While the method of the present invention is most advantageously utilized in an environment in which the temperature is above 800° F., it is theoretically possible to utilize any temperature below 800° F. and still accomplish bonding, depending upon the applied potential to the electrodes.

The bonding of the metal to ceramic may be explained in terms of enhanced diffusion due to the applied potential. This may be expressed by an equation of the type $$D=Doe-\left[U-\frac{ZV}{x}L\right]/kT \qquad (1)$$

$U$=activation energy for diffusion
$Z$=charge on the particle
$V/x$=voltage gradient
$L$=distance which the particle moved also $$\frac{\partial c}{\partial t}=D\frac{\partial c}{\partial x} \qquad (2)$$

If potential drop occurs essentially at the surface, then $x$ will be very small and about the same as L. In this case, for a single charged particle:

$$D=Doe-[U-V]/kT \qquad (3)$$

If V is about the same as U, the diffusion rate would be increased to a large extent. By viewing the first equation, it is evident that an increase in temperature will also increase the diffusion rate.

The formation of bonded joints between metals and ceramics, or two metal surfaces only, occurs most advantageously when the metal to be bonded is made positive in a direct current electrical potential field under various conditions of voltage, current, pressure, temperature, and time. As indicated in the example discussed relative to the drawing, the flow of silver-metal ions of a silver-plated molybdenum-to-ceramic combination is across the barrier interface into the ceramic material. The migration of the silver ions produces a diffusion-type of bond at temperatures that are normally so low that the phenomena could not occur by straight thermal-type diffusion. This low temperature bonding technique, which requires intimate contact between the mating surfaces to be bonded, will produced strong bonds with a minimum of distortion and oxidation products.

Scientific knowledge of the phenomena of the present invention is far from complete; however, it is apparent that various parameters do effect the rapidity and completeness of the bonding process. Such factors as the size of the ions, the magnitude of the charge on the ions, the diffusion coefficient of the materials, their physical orientation with respect to the electrostatic field, and the field gradient across the interface affect the process considerably.

As mentioned previously, any two materials in initimate contact under conditions of temperature and pressure will tend to diffuse ions or atoms into each other across the interface. Due to differences in diffusion coefficients and solubility rates, one material will more readily diffuse into the other. That is, more ions of one material will escape its lattice structure and move across the material interface and diffuse into the lattice structure of the other than will occur in the opposite direction. The present invention advantageously utilizes this commonly known phenomena and provides a method for enhancing this tendency to diffuse. By the proper application of a relatively large electrostatic field, properly oriented with respect to the contacting materials, the positive field potential will tend to drive positive ions of the more soluble material rapidly across the interface and diffuse the same into the less soluble second material to effect a high strength bond therebetween. Obviously, if the material adjacent the positive electrode was a metal having double-charge ions, the tendency for the ions to escape or to be driven by the applied positive potential across the interface would be increased.

The method of the present invention may be used advantageously for bonding many types of ceramics to metals such as silver-plated metals and dense ceramic materials and the bonds thus formed are generally stronger than the adhesion of the silver plate to the base metal. In the case of foam-type ceramic materials, the bonds generated are stronger than the strength of the foam material. The bonding of metal to light weight foam ceramics is difficult to accomplish, because the ceramic material crushes easily at the bond interface on application of the bonding pressure. Since, under the method of the present invention, the requirement of extremely high bonding pressures is eliminated, this in itself would allow some metal bonding to light weight foam ceramics. However, to insure against crushing of the ceramic material, the method of the present invention in this case includes the additional step of first treating the surface of the foamed ceramic with a slurry of aluminum oxide or zirconium oxide powder, plus a phosphate binder. The slurry treated surface, which, for example, is approximately one-eighth inch in thickness after firing at 900° for two hours, provides a smooth, dense hard surface. Bonds which are thus formed in the manner of the illustrative example discussed previously results in a structure in which the bond between the surface and the silver-plated metal is stronger than the strength of the foam ceramic beneath the fired surface.

The method of the present invention has further application to the bonding of a ceramic, semiconductor or metal to other semiconductors or metals in which the opposed surfaces of the ceramic or specimen may be bonded separately by successive bonding steps to elements of similar or different material. For instance, a silver-plated molybdenum plate may first be bonded to a dense aluminum oxide block. The specimen including the plate is then placed back in the bonding circuit with the previously bonded metal plate made negative in the electrical circuit and a new silver-plated molybdenum plate made positive. The second bonding process bonds a new molybdenum plate securely to the ceramic block and does not effect the bond to the first plate. It is to be noted that in such cases the failure of the joints occurs at the silver-to-molybdenum interface rather than between the silver and ceramic interfaces, indicating an extremely strong ceramic-to-metal bond.

The method of the present invention has additional application to the production of metal-to-metal bonds. One example involves the bonding of nickel to molybdenum. No bonding occurs when the nickel is negative and the molybdenum is positive; however, extremely strong bonds occur when the nickel is made positive. A good bond occurs in an inert gas atmosphere, a temperature of 900° F., a bonding time of four hours and an electrical potential of 800 to 1000 volts. The bonds formed indicate that the nickel atoms or ions diffuse into the molybdenum and very little diffusion takes place in the reverse direction. Metal-to-metal bonds involving copper strip and molybdenum, and aluminum strip and copper have also been made by making the strip material positive with an electrical potential of 4000 to 7000 volts and an operating time of four hours at 900° F. The bonding of P-type lead telluride thermoelectric elements to a pure iron face may be accomplished quite easily by using the bonding technique of the present invention. It is to be noted that the process of the present invention produces a bond between silver and ceramics at a temperature as low as 800° F. This type of bond cannot be duplicated by other known processes except at temperatures near or in excess of the melting point of silver.

As a result of experimentation, in addition to the several of the examples noted previously, effective bonding of the following material combination has been achieved; silver-plated molybdenum to Pyroceram No. 9606 (high temperature glass), silver-plated Fernico No. 5 (Fe-Ni-Co alloy) to glass, silver to inconel, aluminum to copper, silver to copper, and silver-aluminum to copper. Reference may be had to the following table showing the typical parameters for fabricating metal-to-metal and metal-to-ceramic bonds:

*Table 1.—Typical parameters for fabricating metal-to-metal and metal-to-ceramic bonds*

| Bond Combination | Positive Member | Voltage (max.) | Current (microamps) | Temp. (° F.) | Time (hrs.) | Type of Atmosphere | Bond Results |
|---|---|---|---|---|---|---|---|
| Coarse silicon carbide foam to silver-plated molybdenum. | Mo | 3,000 | (*) | 900 | 4 | Air | Bond stronger than foam material. |
| Fine silicon carbide foam to silver-plated molybdenum. | Mo | 3,700 | 80 | 900 | 4 | do | Do. |
| Dense aluminum oxide fire brick to silver-plated molybdenum. | Mo | 2,600 | 82 | 900 | 4 | do | Bond stronger than adhesion of silver to molybdenum. |
| Dense beryllium oxide to silver-plated molybdenum. | Mo | 3,500 | (*) | 1,000 | 2¼ | do | Strong bond. |
| Silicon carbide foam impregnated with zirconium oxide slurry. | Mo | 3,000 | (*) | 900 | 2 | do | Bond stronger than foam material. |
| Silicon carbide foam faced with aluminum oxide slurry. | Mo | 5,000 | (*) | 900 | 4½ | do | Do. |
| Silicon carbide foam faced with zirconium oxide slurry. | Mo | 3,000 | (*) | 900 | 4½ | do | Do. |
| Zirconium oxide foam faced with zirconium oxide slurry. | Mo | 2,000 | (*) | 900 | 4 | do | Do. |
| Aluminum oxide foam faced with aluminum oxide slurry. | Mo | 5,000 | (*) | 900 | 4½ | do | Do. |
| | Mo | 6,000 | (*) | 800 | 4½ | do | Do. |
| | Mo | 7,000 | (*) | 700 | 4½ | do | Do. |
| Nickel foil to molybdenum | Ni | 800 | (*) | 900 | 4 | Helium | Strong bond. |
| Molybdenum to Nickel foil | Mo | 1,000 | (*) | 900 | 4 | do | No bonding. |
| "P" type lead telluride thermal electric element to pure iron. | Lead telluride. | 2,000 | 33 | 1,100 | 4½ | do | Strong bond. |

*Current measuring devices not adequate to measure currents involved.

The table is of course only indicative of some of the applications to which the method of the present invention may be advantageously put to use and it is not intended that Table 1 be interpreted as a limitation on the range of possible applications of the present method.

While there have been shown and described and pointed out the fundamental novel features of the invention as applied to a preferred method, it will be understood that various omissions and substitutions and changes in the form and detail of the device illustrated and its method of operation may be had by those skilled in the art without departing from the spirit of the invention. It is the intention, therefore, to be limited only as indicated by the scope of the following claims.

What is claimed is:

1. The method of diffusion bonding of a first material to a second material wherein at least one material is soluble in the other, said method comprising the steps of: forming a stacked array consisting in order of; a first electrode, an insulative barrier, one of said materials, said other material, a second electrode; exerting sufficient pressure on said stack to effect intimate contact between the individual members thereof, subjecting said pressurized array to an elevated temperature for an extended time period while a direct current potential difference is applied across said electrodes of sufficient magnitude to effect diffusion of ions from one of said materials to the other material to produce a good mechanical bond therebetween but of insufficient magnitude to effect extensive current flow between said electrodes.

2. The method of claim 1 wherein said first material is selected from a group consisting of a ceramic, a semiconductor and a metal, and a second material is selected from a group consisting of a semiconductor and a metal.

3. The method of claim 1 wherein said first material comprises a ceramic material selected from the group consisting of coarse silicon carbide foam, fine silicon carbide foam, dense aluminum oxide, dense beryllium oxide, silicon carbide foam impregnated with zirconium oxide slurry, silicon carbide foam faced with aluminum oxide slurry, silicon carbide foam faced with zirconium oxide slurry, zirconium oxide foam faced with zirconium oxide slurry, aluminum oxide foam faced with aluminum oxide slurry, and said second material comprises a metal selected from the group consisting of: silver-plated molybdenum, nickel, and iron.

4. The method as claimed in claim 1 wherein said stacked array is subjected to a temperature in the range of 700° F. to respective solidus temperature for a period of time of in the range of two to five hours and said potential difference between said electrodes is in the range of 500 to 10,000 volts.

5. The method of diffusion bonding of a first material to a second material wherein at least one material is soluble in the other, said method comprising the steps of: forming a stacked array consisting in order of, a negative electrode, an insulative barrier, said first material, said second material, a positive electrode; exerting sufficient pressure on said stacked array to effect intimate contact between the individual members thereof; subjecting said pressurized stacked array to a temperature below the solidus temperature of either of said selected materials for an extended time period while providing a relatively high direct current potential difference across said electrodes of sufficient magnitude to effect diffusion of ions from said material adjacent said positive electrode to said material closest to said negative electrode to produce a good mechanical bond therebetween but of insufficient magnitude to effect extensive current flow between said electrodes.

6. The method of diffusion bonding as claimed in claim 5 wherein said first material is selected from a group consisting of a ceramic, a semiconductor and a metal, and said second material is selected from a group consisting of a semiconductor and a metal.

7. The method of claim 5 further including the step of subjecting said materials to an inert atmosphere or vacuum to prevent oxidation thereof.

8. The method as claimed in claim 5 wherein said first material is selected from a group consisting of: silicon carbide, aluminum oxide, beryllium oxide, molybdenum, iron, glass, Inconel, copper and molybdenum, and said second material is selected from a group consisting of: molybdenum, nickel, lead telluride, copper, aluminum, and silver; said time period is in the range of two to five hours and said potential difference is in the range of 500 volts to 10,000 volts.

9. The method of diffusion bonding of a first material to a second material wherein at least one material is soluble in the other, said method comprising the steps of: effecting intimate contact between said first material and said second material, subjecting said contacting materials to an elevated temperature for an extended time period while subjecting the same to a direct current potential difference of sufficient magnitude across their interface to effect diffusion of ions from one of said materials to said other material to produce a good mechanical bond therebetween while maintaining minimum current flow through said material.

10. The method of diffusion bonding as claimed in claim 9 wherein said first material is selected from the group consisting of a ceramic, a semiconductor and a metal, and said second material is selected from a group consisting of a semiconductor and a metal.

11. The method as claimed in claim 9 wherein said first material is selected from a group consisting of silicon carbide, aluminum oxide, beryllium oxide, molybdenum, iron, glass, Inconel, copper and molybdenum, and said second material is selected from a group consisting of: molybdenum, nickel, lead telluride, copper, aluminum and silver.

12. The method as claimed in claim 9 wherein said time period is in the range of two to five hours and said potential difference is in the range of 500 volts to 10,000 volts.

13. The method of diffusion bonding of a first material to a second material wherein at least one material is soluble in the other, said method comprising the steps of: effecting intimate contact between said first material and said second material, subjecting said contacting first and second materials to a relatively high temperature for an extended time period while subjecting said second material to a relatively high positive direct current potential with respect to said first material of sufficient magnitude to effect diffusion of ions from said second material to said first material to produce a good mechanical bond therebetween while maintaining minimum current flow between said materials.

14. The method as claimed in claim 13 wherein said first material is selected from a group consisting of a ceramic, a semiconductor and a metal, and said second material is selected from a group consisting of a semiconductor and a metal.

15. The method as claimed in claim 13 wherein said materials are subjected to a temperature in the range of 700° F. to respective solidus temperature for a time period in the range of two to five hours and said positive direct current potential is in the range of 500 to 10,000 volts.

16. The method as claimed in claim 15 wherein said first material is selected from a group consisting of silicon carbide, aluminum oxide, beryllium oxide, molybdenum, iron, glass, Inconel, copper and molybdenum and said second material is selected from a group consisting of molybdenum, nickel, lead telluride, copper, aluminum and silver.

References Cited by the Examiner

UNITED STATES PATENTS

| | | | |
|---|---|---|---|
| 3,158,732 | 11/1964 | Kazakov | 29—497.5 X |
| 3,200,491 | 8/1965 | Walker et al. | 29—497.5 X |

JOHN F. CAMPBELL, *Primary Examiner.*